US010505258B2

(12) United States Patent
Lee et al.

(10) Patent No.: US 10,505,258 B2
(45) Date of Patent: Dec. 10, 2019

(54) RADIO FREQUENCY ISOLATOR

(71) Applicant: Analog Devices Global Unlimited Company, Hamilton (BM)

(72) Inventors: Check F. Lee, Bedford, MA (US); Bernard P. Stenson, Limerick (IE); Baoxing Chen, Westford, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 96 days.

(21) Appl. No.: 15/226,438

(22) Filed: Aug. 2, 2016

(65) Prior Publication Data
US 2018/0040941 A1 Feb. 8, 2018

(51) Int. Cl.
*H01Q 13/00* (2006.01)
*H01Q 1/24* (2006.01)
*H01Q 1/48* (2006.01)
*H01Q 9/06* (2006.01)
*H01Q 15/14* (2006.01)
*H01Q 1/38* (2006.01)
*H01Q 13/02* (2006.01)
*H01Q 13/06* (2006.01)
*H01Q 19/30* (2006.01)
*H04B 5/00* (2006.01)

(52) U.S. Cl.
CPC .............. *H01Q 1/243* (2013.01); *H01Q 1/38* (2013.01); *H01Q 1/48* (2013.01); *H01Q 9/065* (2013.01); *H01Q 13/02* (2013.01); *H01Q 13/06* (2013.01); *H01Q 15/14* (2013.01); *H01Q 19/30* (2013.01); *H04B 5/005* (2013.01); *H01L 2224/73265* (2013.01)

(58) Field of Classification Search
CPC .......... H01Q 1/243; H01Q 1/48; H01Q 15/14; H01Q 9/065
USPC ........................................................ 343/772
See application file for complete search history.

(56) References Cited

U.S. PATENT DOCUMENTS

| 5,652,596 | A | 7/1997 | Abrams et al. | |
|---|---|---|---|---|
| 7,629,937 | B2 * | 12/2009 | Lier | H01P 3/12 343/772 |
| 8,364,195 | B2 | 1/2013 | Spina et al. | |
| 8,378,776 | B1 | 2/2013 | Gabrys et al. | |
| 8,427,844 | B2 | 4/2013 | Ho et al. | |
| 8,674,486 | B2 | 3/2014 | Haigh et al. | |
| 2006/0022876 | A1 * | 2/2006 | Sonoda | H01Q 1/38 343/700 MS |
| 2006/0038723 | A1 * | 2/2006 | Watanabe | H01Q 1/1271 343/700 MS |

(Continued)

OTHER PUBLICATIONS

[No Author Listed], CMOS Digital Isolators Supersede Optocouplers in Industrial Applications. Silicon Laboratories, Inc. Rev 0.2. Oct. 28, 2010. 18 pages.

(Continued)

*Primary Examiner* — Huedung X Mancuso
(74) *Attorney, Agent, or Firm* — Wolf, Greenfield & Sacks, P.C.

(57) ABSTRACT

Radio frequency (RF) isolators are described, coupling circuit domains operating at different voltages. The RF isolator may include a transmitter which emits a directional signal toward a receiver. Layers of materials having different dielectric constants may be arranged to confine the emission along a path to the receiver. The emitter may be an antenna having an aperture facing the receiver.

20 Claims, 12 Drawing Sheets

(56) References Cited

U.S. PATENT DOCUMENTS

| | | | |
|---|---|---|---|
| 2007/0121249 A1 | 5/2007 | Parker | |
| 2007/0285314 A1* | 12/2007 | Mortazawi | H01Q 1/3233 |
| | | | 342/375 |
| 2008/0030080 A1 | 2/2008 | Chen et al. | |
| 2008/0061631 A1 | 3/2008 | Fouquet et al. | |
| 2008/0205495 A1 | 8/2008 | Trott | |
| 2008/0238796 A1* | 10/2008 | Rofougaran | H01Q 1/005 |
| | | | 343/776 |
| 2008/0311862 A1 | 12/2008 | Spina et al. | |
| 2010/0033395 A1* | 2/2010 | Ding | H01Q 1/2283 |
| | | | 343/834 |
| 2010/0176660 A1 | 7/2010 | Fouquet et al. | |
| 2012/0326939 A1* | 12/2012 | Cannon | H01Q 19/027 |
| | | | 343/840 |
| 2014/0198013 A1* | 7/2014 | Saraswat | H01L 21/486 |
| | | | 343/893 |
| 2014/0252533 A1 | 9/2014 | O'Sullivan | |
| 2014/0285277 A1 | 9/2014 | Herbsommer et al. | |
| 2014/0346887 A1 | 11/2014 | Bhamidipati et al. | |
| 2015/0295307 A1 | 10/2015 | Cook et al. | |
| 2017/0040671 A1* | 2/2017 | Kim | H01R 12/714 |
| 2018/0048048 A1* | 2/2018 | Socher | H01Q 1/2283 |

OTHER PUBLICATIONS

International Search Report and Written Opinion dated Dec. 19, 2017 in connection with International Application No. PCT/IB2017/001105.

PCT/IB2017/001105, Feb. 5, 2019, International Preliminary Report on Patentability.

International Preliminary Report on Patentability dated Feb. 5, 2019 in connection with International Application No. PCT/IB2017/001105.

* cited by examiner

US 10,505,258 B2

RADIO FREQUENCY ISOLATOR

FIELD OF THE DISCLOSURE

The present application is directed to galvanic isolators.

BACKGROUND

Isolators provide electrical isolation between circuits which communicate with each other. Some such isolators are used to electrically isolate a first circuit, operating in a relatively high voltage domain, from a second circuit, operating in a relatively low voltage domain. The two circuits are sometimes referenced to different ground potentials. An isolation barrier is provided between the two circuits to prevent undesirable voltage cross-over. The isolator provides communication across the isolation barrier.

BRIEF SUMMARY OF THE DISCLOSURE

Radio frequency (RF) isolators are described, coupling circuit domains operating at different voltages. The RF isolator may include a transmitter which emits a directional signal toward a receiver. Layers of materials having different dielectric constants may be arranged to confine the emission along a path to the receiver. The emitter may be an antenna having an aperture facing the receiver.

In some embodiments, a radio frequency isolator is provided, comprising a dielectric layer having a dielectric constant between 5 and 500 for frequencies between 5 GHz and 200 Ghz, first and second antennae disposed at least partially within, or within ten microns of, the dielectric layer, and a feed circuit coupled to the first antenna.

In some embodiments, a method is provided, comprising emitting a radio frequency signal from a first microfabricated antenna operating in a first voltage domain, the radio frequency signal having a frequency between 5 GHz and 200 GHz, confining and transmitting the radio frequency signal through a dielectric layer having a dielectric constant between 5 and 500, and receiving the radio frequency signal with a second microfabricated antenna operating in a second voltage domain different than the first voltage domain.

In some embodiments, a system is provided, including a first circuit operating in a first voltage domain, a second circuit operating in a second voltage domain less than the first voltage domain, and a radio frequency isolator coupling the first and second circuits to each other. In some embodiments, the radio frequency isolator comprises a dielectric layer having a dielectric constant between 5 and 500 for frequencies between 5 GHz and 200 Ghz, first and second antennae disposed at least partially in, or within 10 microns of, the dielectric layer, and a feed circuit coupled to the first antenna.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the present application are directed to an isolator that communicates radio frequency (RF) signals. The isolator includes two micromachined antennae, one transmitting and one receiving, that are separated by a dielectric material. The transmitted radio frequency signals are confined to the dielectric material, and therefore the dielectric material is shaped to create a transmission pathway between the antennae for the radio frequency signals. To facilitate the confinement of the radio frequency signals in the dielectric material, the dielectric material may be provided with a higher dielectric constant than surrounding materials.

The antennae may take various forms. In some embodiments, the antennae are horizontal dipoles. In some embodiments the dipoles are linear. In other embodiments, the dipoles are curved. In some embodiments, the antennae emissions are directional, for example being directed by a horn, reflector, antenna array, or other suitable structure to direct the emissions toward the receiving antenna. When included, the reflector may be linear, curved, or planar (or a sheet). When included, the horn may take one of various shapes, such as being curved (including a plurality of piece-wise linear segments), a piece-wise linear polygon, a parabola, or a section of an ellipse.

Figure 1:
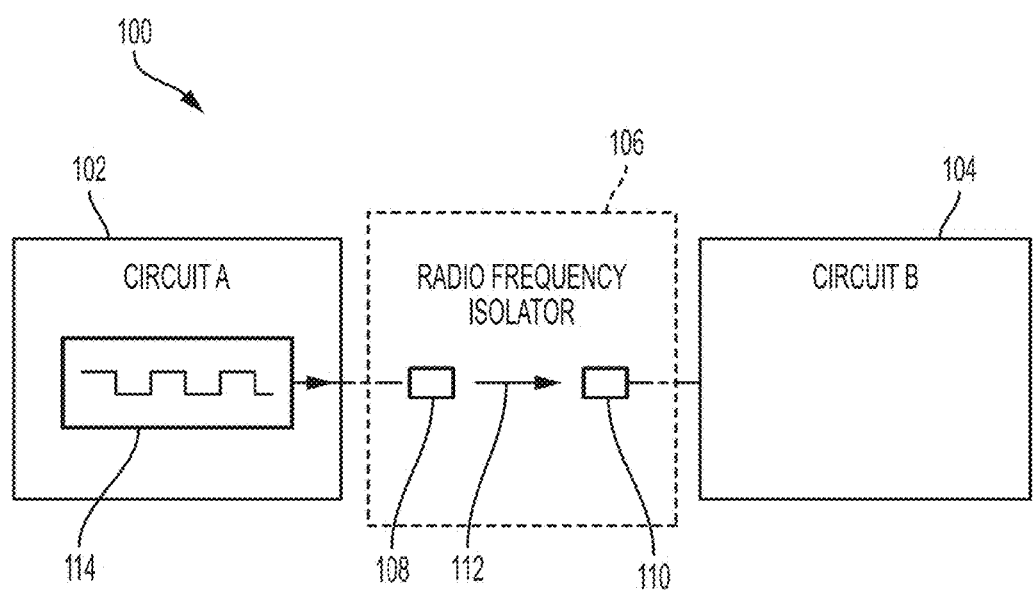
FIG. 1 is a block diagram of an electronic system including two circuits coupled by a radio frequency isolator.

FIG. 1 is a block diagram of an electronic system including two circuits coupled by a radio frequency isolator, according to an embodiment of the present application. The electronic system 100 includes circuit 102, also referred to herein as "Circuit A," and circuit 104, also referred to herein as "Circuit B," communicatively coupled by a radio frequency isolator 106. The radio frequency isolator 106 includes a transmitter 108 and a receiver 110 which communicate a radio frequency signal 112 between them. The radio frequency signal may be provided by a component 114, such as a signal generator. The radio frequency signal may be analog or digital, and may have frequencies assuming any value or range of values in the range between 5 GHz and 200 GHz, for example.

Circuit 102 and circuit 104 may be circuits operating in different voltage domains and/or having different ground potentials. For example, circuit 102 may operate in a higher voltage domain than circuit 104. One non-limiting example is that circuit 102 may be part of a measurement system, while circuit 104 may be part of a control system for controlling the measurement system. As a further example, circuit 102 may form part of high voltage industrial machinery, while circuit 104 may be a control system for the machinery. Other types of circuits may alternatively be implemented.

The radio frequency isolator 106 may be a galvanic isolator configured to provide galvanic isolation between circuits 102 and 104, while allowing for communication between the circuits 102 and 104 via radio frequency signals. The communication may be unidirectional (e.g., from the transmitter 108 to receiver 110), or bidirectional. For purposes of simplicity of the description of FIG. 1, the communicating elements of isolator 110 are referred to as a transmitter and receiver, but it should be appreciated that transmitter 108 and receiver 110 may be reversed, or that they may both be configured to transmit and receive, and thus in some embodiments may be transceivers.

The transmitter 108 and receiver 110 may be antennae in some embodiments. Examples are described in further detail below in connection with FIGS. 6A, 6B, 7A, 7B, 8A, 9A, and 9B. The antennae may be configured to emit and/or receive transverse electric (TE), quasi TE, transverse magnetic (TM), or quasi TM modes of radio frequency signals. The transmitter 108 and receiver 110 may be dipole antennae, or an antenna array. To transmit and receive the radio frequency signal 112, the transmitter 108 and receiver 110 may be directional, having apertures facing each other. For example, one or both may include a feed with a horn. Shielding or other features for providing directed emission and reception may be used, examples of which are described below in connection with FIGS. 6A, 6B, 7A, 7B, 9A and 9B.

The radio frequency isolator 112 may include a confinement structure between the transmitter 108 and receiver 110, not explicitly shown in FIG. 1 but shown and described further below. The confinement structure may include a layer of high dielectric constant material. The high dielectric constant material may have a dielectric constant higher than that of surrounding materials, such as having a dielectric constant greater than 5 (e.g., any value between 5-500, including any value between 12 and 200). As used herein, the terminology "low dielectric constant" refers to any dielectric constant less than or equal to 5, and the terminology "high dielectric constant" refers to any dielectric constant greater than 5. In this manner, the radio frequency signal 112 may be confined within the layer, thus increasing coupling efficiency between the transmitter 108 and receiver 110. The listed values of dielectric constants may correspond to the frequencies of interest of operation of the radio frequency isolator, such as those listed above between 5 GHz and 200 GHz.

Figure 2:
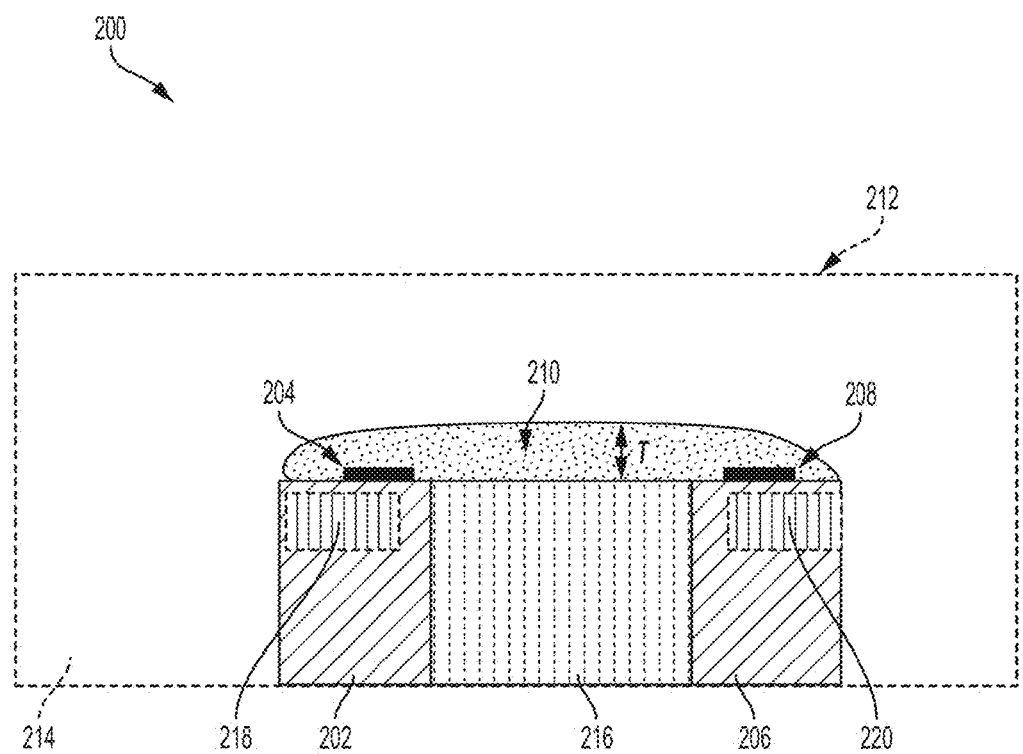
FIG. 2 is a cross-sectional view of a radio frequency isolator having two antennae coupled by an in-plane dielectric material.

FIG. 2 provides a non-limiting example of an implementation of the radio frequency isolator 106 of FIG. 1. FIG. 2 is a cross-sectional view of a radio frequency isolator 200 having two antennae coupled by an in-plane dielectric material. The radio frequency isolator 200 includes a first die 202 having a first antenna 204 formed thereon, and a second die 206 having a second antenna 208 formed thereon. The first antenna 204 and second antenna 208 are formed within a dielectric layer 210. The isolator 200 is packaged within a package 212. The package may include an encapsulation material 214. Optionally, a support 216 is provided between die 202 and die 206 to support the dielectric layer 210. However, such a support is optional because the dielectric layer 210 may be manufactured in ways in which the support is not needed.

The die 202 and 206 may be any suitable type of die for supporting the antenna 204 and 208, respectively. Additionally, in some embodiments the die 202 and/or die 206 may include circuitry, such as circuitry 218 and 220. In some embodiments, the die 202 and 206 are semiconductor die, such as silicon die, although alternative types of semiconductors or other materials may be used in some embodiments.

Figure 6A:
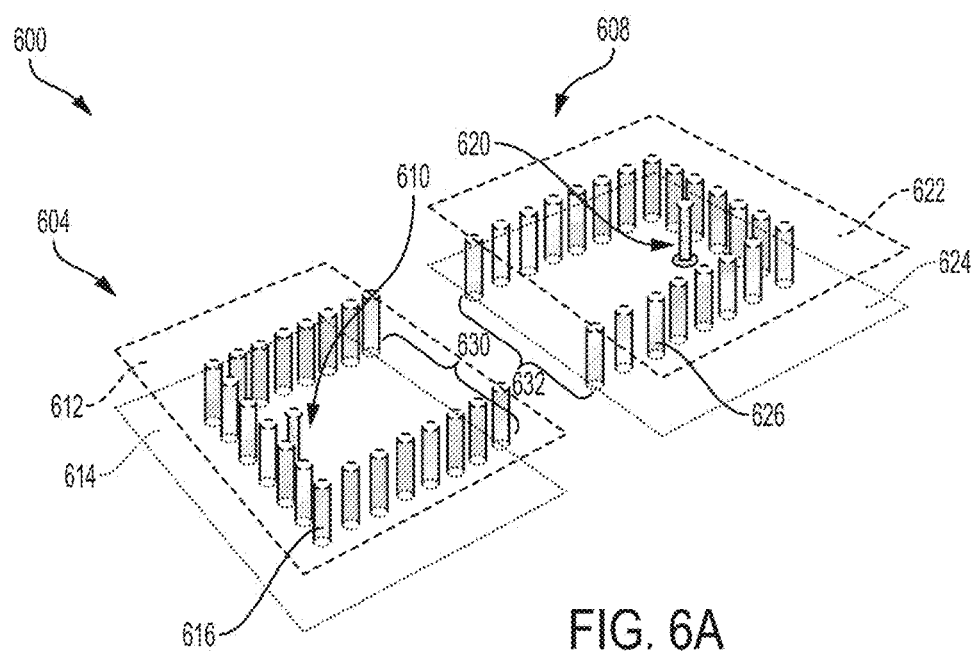
FIGS. 6A-6B illustrate a perspective view and cross-sectional view, respectively, of a radio frequency isolator having two antennae with oppositely oriented apertures.
Figure 7A:
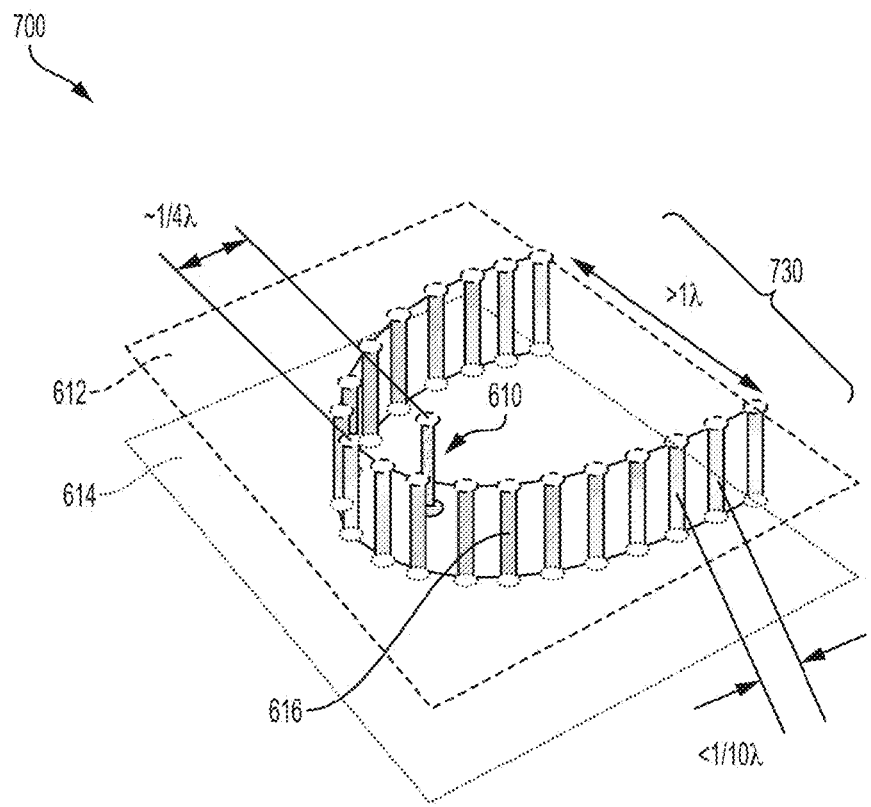
FIG. 7A is a perspective view of an antenna of an isolator.

The antenna 204 and 208 may be any suitable type of antenna for transmitting radio frequency signals. As described above in connection with FIG. 1, they may be dipole antennae, or an antenna array. Examples are shown in FIGS. 6A and 7A. It should be appreciated from FIG. 2 that they may be micromachined (microfabricated) antenna formed using planar micromachining (microfabrication) techniques. For example, the antenna 204 and 208 may be patterned metal layers. They may include a feed with a horn, or other directional structures.

The dielectric layer 210 is a substantially planar layer, and may have a dielectric constant selected to confine therein radio frequency signals emitted by one of antenna 204 or 210. For example, dielectric layer 210 may be a high dielectric constant material. Such confinement may be achieved by selecting a dielectric constant greater than that of surrounding materials, such as encapsulating material 214. Encapsulating material 214 may be conventional semiconductor encapsulation material used in packaging semiconductor die, and thus may have a dielectric constant less than 4. Accordingly, the dielectric layer 210 may have a dielectric constant greater than that (e.g., between 5 and 500, between 12 and 200, between 15 and 100, between 20 and 50, or any value or range of values within such ranges). Non-limiting examples of materials which may be used for the dielectric layer 210 include hafnium oxide, aluminum oxide, zirconium oxide, titanium oxide, tantalum oxide. Because the dielectric layer 210 may be configured to confine radio frequency signals emitted by antenna 204 or antenna 208, it may be dimensioned to provide a desired spatial confinement. For example, in some embodiments the dielectric layer 210 may have a thickness (or height) T substantially equal to a height of the antenna 204 and/or antenna 208. In some embodiments, the thickness T may be less than twice the height of the antenna 204 and/or antenna 208, between three-quarters and five times the height of the antenna, between one and three times the height of the antenna, or any value within such ranges. The thickness T may be at least 10 microns in some embodiments, approximately 0.5 mm, between 5 microns and 5 mm, between 10 microns and 2 mm, or any value or range of values within that range, as non-limiting examples.

The dielectric layer 210 may optionally be surrounded by dielectric layers having lower dielectric constants. In some embodiments, the dielectric layer 210 may be formed from multiple dielectric layers.

The package 212 may be any suitable type of package for packaging semiconductor structures. For example, the package 212 may be a plastic package with leads, or other suitable packaging. In some embodiments, the package 212 may be configured to mount on a printed circuit board.

Figure 3:
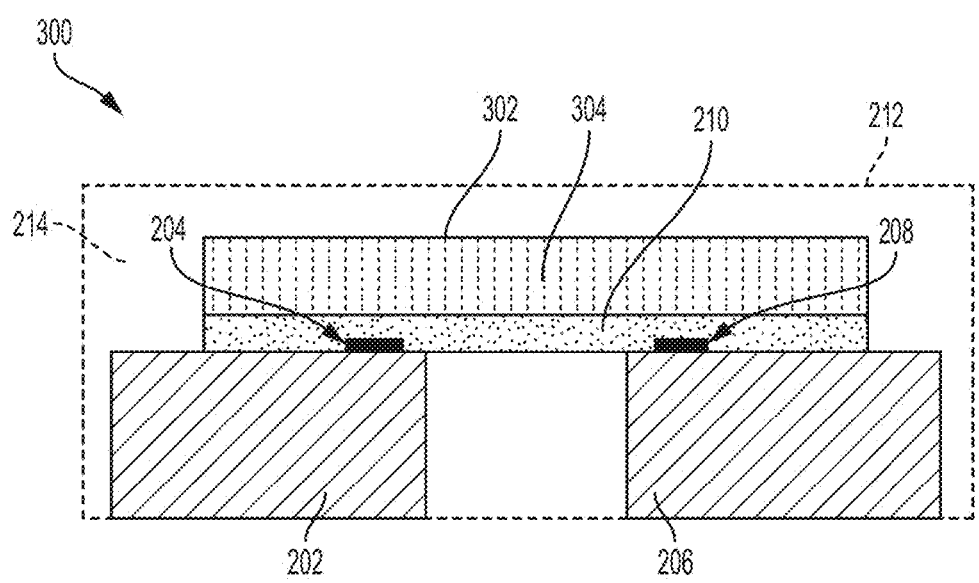
FIG. 3 is a cross-sectional view of a radio frequency isolator having two antennae coupled by an in-plane dielectric material.

FIG. 3 is a cross-sectional view of another radio frequency isolator having two antennae coupled by an in-plane dielectric material. The radio frequency isolator 300 includes many of the same components described in connection with radio frequency isolator 200. However, in the embodiment of FIG. 3 the radio frequency isolator includes substrate 304 on which the dielectric layer 210 may be formed. The combination of substrate 304 and dielectric layer 210 may form a separate die 302, distinct from the die 202 and 206. Thus, the structure of FIG. 3 may lend itself to different fabrication techniques than the structure of FIG. 2. For example, to form the radio frequency isolator 300 of FIG. 3 the die 302 may be formed by depositing the dielectric layer 210 on the substrate 304. The substrate 304 may be a dielectric substrate, with a dielectric constant less than that of the dielectric layer 210. After formation of the dielectric layer 210 on the substrate 304, the die 302 may be flipped and bonded with the die 202 and 206. In some embodiments, the antenna 204 and 208 may be included in the die 302.

Figure 4A:
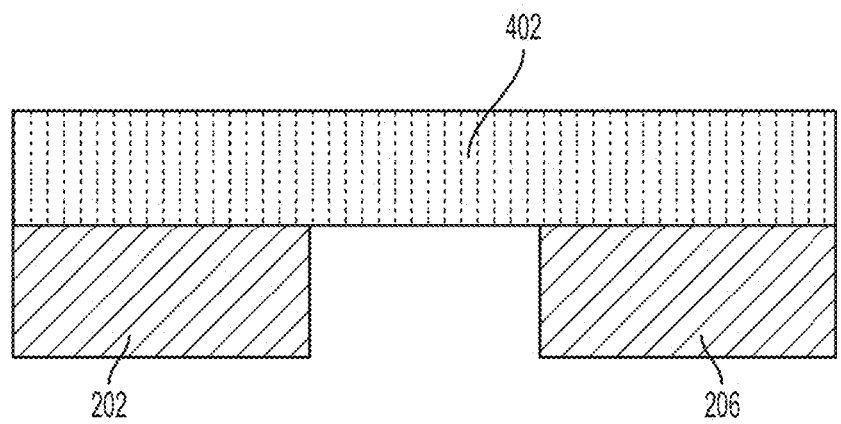
FIG. 4A is a cross-sectional view of a radio frequency isolator comprising three die.
Figure 4B:
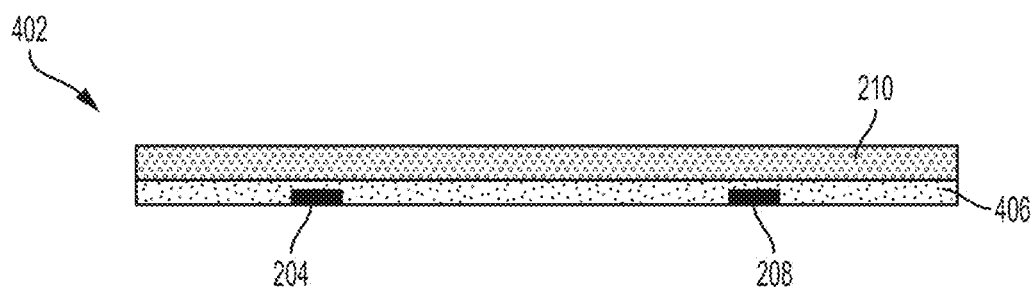
FIGS. 4B-4C are cross-sectional views of examples of the die of FIG. 4A including two antennae coupled by an in-plane dielectric material.
Figure 4C:
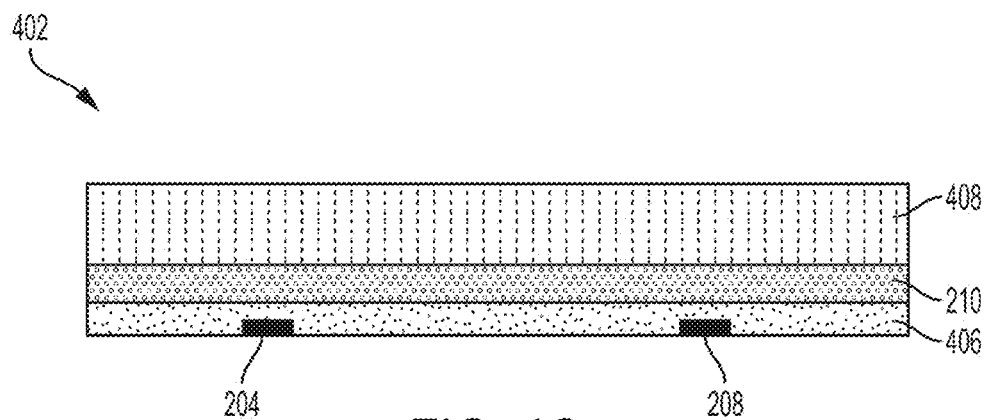
Figure 4D:
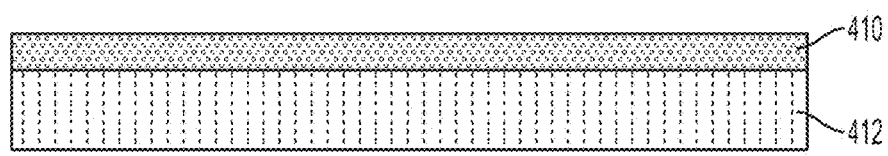
FIGS. 4D-4E are cross-sectional views of examples of the die of FIG. 4A including circuitry.
Figure 4E:
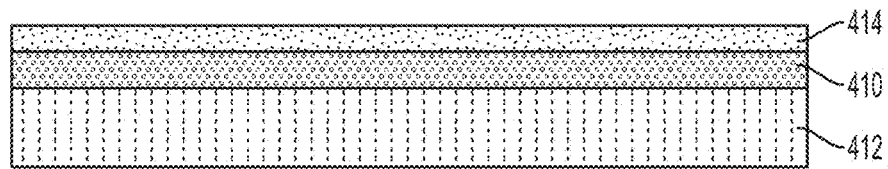

FIG. 4A shows a generalized version of the radio frequency isolator of FIG. 3, in which three die are included, 202, 206, and 402. Die 402 may take various forms, options of which are shown in FIGS. 4B-4C, and may contain insulated single or multilayered dielectrics and transmit-side and receive-side antennae (e.g., horizontal dipoles). Dies 202 and 206 may also take various forms, examples are which are shown in FIGS. 4D-4E, and may include active and passive antenna feed circuits coupled to the transmit-side and receive-side antennae of die 402.

The die 402 may take one of several forms. As a non-limiting example, the die 402 may include a high dielectric material. The antennae of the radio frequency isolator may be embedded therein. According to an embodiment, the die 402 includes a single layer of high dielectric material having two horizontal dipoles disposed therein.

FIG. 4B illustrates an alternative construction of the die 402. In this non-limiting example, the die 402 includes the dielectric layer 210 and a low dielectric buffer layer 406. Antennae 204 and 208 may be embedded within the low dielectric constant buffer layer 406 as shown or, alternatively, in the dielectric layer 210. In those embodiments in which the antennae 204 and 208 are embedded in the low dielectric constant buffer layer 406, the radio frequency signals may nonetheless be transported through the dielectric layer 210 between the antennae so long as the antennae are sufficiently close to the dielectric layer 210. In some such embodiments, the antennae are within 10 microns of the dielectric layer 210, within 5 microns of the dielectric layer 210, within 2 microns of the dielectric layer 210, and in some embodiments contact the dielectric layer 210. The low dielectric constant buffer layer 406 may have a thickness between 1 and 500 microns, between 2 and 100 microns, or any value of range of values within such ranges. The low dielectric constant buffer layer 406 may be formed of aluminum oxide, polyimide, or silicon oxide, as non-limiting examples. In some embodiments, the low dielectric constant buffer layer may be formed of multiple buffer layers.

FIG. 4C illustrates a further variation on the die 402, which differs from the embodiment of FIG. 4B in that a low dielectric value multi- or single-layered substrate 408 is included on the dielectric layer 210.

A further example of the die 402 is the construction shown in FIG. 3 for die 302. That is, the die 402 may include the dielectric layer 210 with a substrate 304 as previously described.

FIGS. 4D and 4E illustrate examples of the construction of die 202 and 206. In the example of FIG. 4D, the die 202 and/or die 206 include a circuit layer 410 and a substrate 412. The circuit layer may include active and/or passive circuits, and optionally may include passivation. The substrate 412 may be a silicon substrate, other type of semiconductor substrate, or any other suitable substrate material.

In the embodiment of FIG. 4E, a low dielectric constant buffer layer 414 is included, which may be the same type of buffer material as low dielectric constant buffer layer 406.

The radio frequency isolator of FIG. 4A may be a combination of any of the examples described with respect to die 202, 206, and 402. In one embodiment, the die 402 is a single layer of high dielectric constant material having horizontal dipole antenna embedded therein, and the die 202 and 206 are of the type illustrated in FIG. 4E.

Figure 4F:
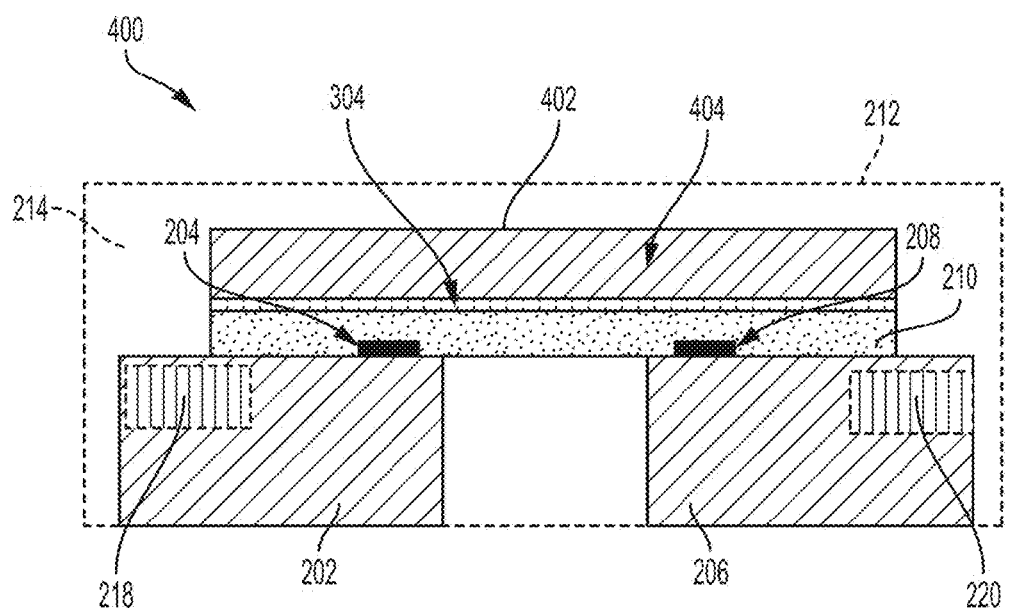
FIG. 4F is a cross-sectional view of an example implementation of the radio frequency isolator of FIG. 4A.

An alternative construction for a radio frequency isolator 400 is shown in FIG. 4F, which is a cross-sectional view of a radio frequency isolator having two antennae coupled by an in-plane dielectric material. The radio frequency isolator 400 differs from previously described radio frequency isolator 300 in that a die 402 is included instead of die 302. The die 402 includes the dielectric layer 210, the substrate 304, and a substrate 404. The substrate 404 may comprise a lossy material. In some embodiments, the substrate 404 comprises a semiconductor material with circuitry, although the circuitry is optional.

Figure 5:
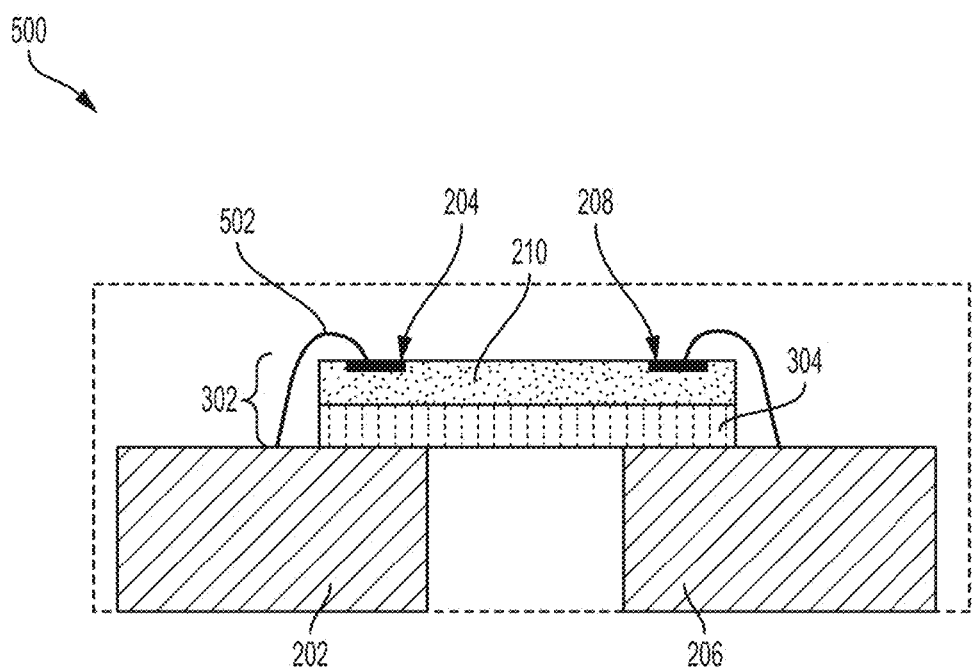
FIG. 5 illustrates an alternative to the structure of FIG. 3, in which the antennae are disposed farther from the surface of the circuit die.

FIG. 5 illustrates an alternative to the radio frequency isolator of FIG. 3. The radio frequency isolator 500 includes the die 302 oriented upside-down compared to its orientation in the isolator of FIG. 3. That is, in the radio frequency isolator 500 the die 302 has the substrate 304 proximate the die 202 and 204, and the dielectric layer 210 distal the die 202 and 206. The antennae 204 and 208 are electrically coupled to the die 202 and 206 via wire bonds 502.

Figure 6B:
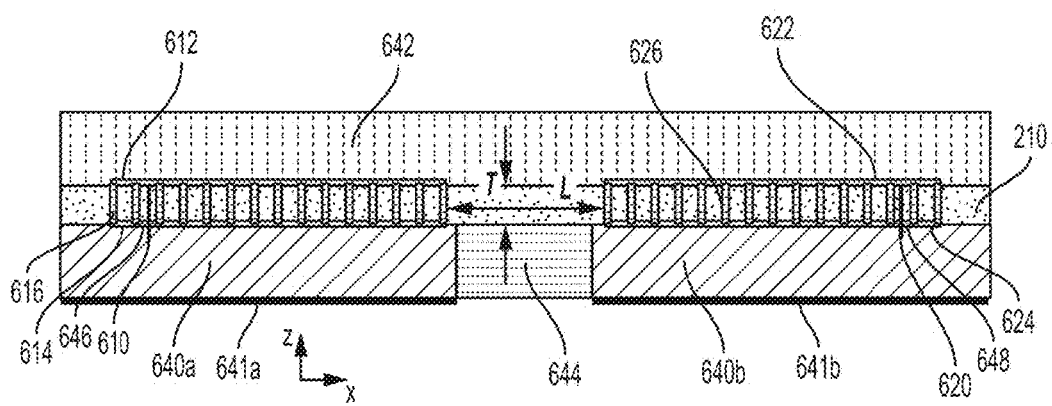

FIGS. 6A-6B illustrate a perspective view and cross-sectional view, respectively, of a radio frequency isolator having two antennae with oppositely oriented apertures. In these examples, the antennae have associated antennae cavities, facing each other. For ease of illustration, FIG. 6A illustrates the antennae components absent surrounding structures, while FIG. 6B includes the surrounding structures.

Referring to FIG. 6A, the radio frequency isolator 600 includes antennae 604 and 608. The antenna 604 includes a feed 610, conductive plates 612 and 614, and a plurality of conductive vias, or posts, 616 defining an aperture 630. The antenna 608 includes a feed 620, conductive plates 622 and 624, and conductive vias, or posts, 626 defining an aperture 632.

The feed 610 and conductive vias 616 may be formed of aluminum, gold, copper, tungsten, or any other suitable conductive material. The conductive plates 612 and 614 may be formed of any of those materials, or other suitable conductive materials. As shown, the conductive vias 616 may contact the conductive plate 612 on one end and conductive plate 614 on an opposite end. The conductive plates 612 and 614 in combination with the conductive vias 616 may constitute a horn of the antenna 604, projecting radio frequency signals from the aperture 630. The conductive vias may, in combination, function as a reflector. In the illustrated embodiment, the conductive vias 616 may be arranged in substantially straight lines forming a "U" shape, with no conductive vias positioned at the aperture 630. Other configurations are possible, including that of FIG. 7A, described further below.

The antenna 608 may be formed of the same materials as the antenna 604. Doing so may simplify fabrication of the structures. Also, proper operation of the isolator 600 may be facilitated by having the antennae 604 and 608 be substantially the same as each other. Thus, in at least some embodiments antennae 604 and 608 are substantially identical but with oppositely facing apertures.

As shown in FIG. 6B, the antenna 604 may be disposed on a first die 640a, with antenna 608 being disposed on a second die 640b. The first die 640a is optionally on a die paddle 641a and the second die 640b is optionally on a die paddle 641b. In some embodiments, one or both of the die 640a and 640b include circuitry, although not all embodiments are limited in this respect. A substrate 642 may be disposed above the dielectric layer 210, and may be glass or another suitable dielectric material. A support 644, for example a third die or a filler material, may be disposed between the first and second die 640a-640b to provide a support for the dielectric layer 210. The support 644 may be formed of a dielectric such as polyimide, or any other suitable material. In at least some embodiments, the dielectric constant of dielectric layer 210 is greater than that of support 644 and substrate 642, which contributes to confining the radio frequency signals exchanged by antennae 604 and 608 to the dielectric layer 210.

As should be appreciated from FIGS. 6A and 6B, the signal from the feed 610 may be projected toward antenna 608 by operation of the conductive plates 612 and 614 and conductive vias 616. The thickness T of the dielectric layer 210, and the relatively high dielectric constant of the dielectric layer 210 compared to that of the substrate 642 and support 644, facilitates confining the radio frequency signals exchanged by antennae 604 and 608 within the dielectric layer 210 as they propagate over the distance L between the antennae 604 and 608. The radio frequency signal may be received by the feed 620 of the antenna 608.

To prevent a short circuit at the location of the feeds 610 and 620, openings 646 and 648 be formed in the conductive plates 614 and 624, respectively. Optionally, openings may also be formed in the conductive plates 612 and 622. In some embodiments, the feed does not contact either conductive plate.

Figure 6C:
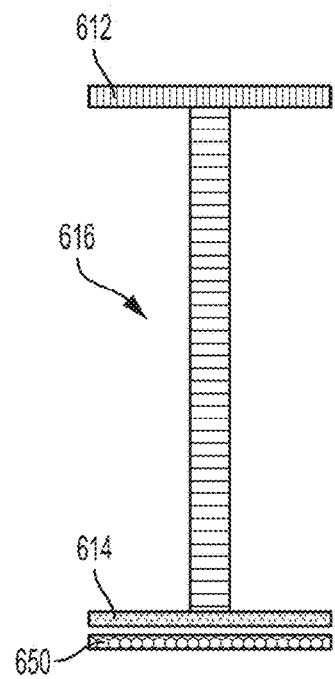
FIG. 6C illustrates a conductive via of a type which may be implemented in the radio frequency isolator of FIGS. 6A-6B.

FIG. 6C illustrates a non-limiting example of the conductive via 616 of FIG. 6A, and may represent any of the conductive vias of the radio frequency isolator 600, including the conductive vias 626. It can be seen that the opposing ends of the conductive via 616 contact the conductive plates 612 and 614. In some embodiments, the conductive via 616 and conductive plates 612 and 614 may be part of a die including substrate 642 and dielectric layer 210. Optionally, an additional conductive layer 650 may be included to contact the conductive plate 614 (e.g., making direct contact with the conductive plate 614). The conductive layer 650, which may be a metal or other conductive material, such as any of those previously described with respect to conductive vias of the radio frequency isolator 600, may be part of die 640a. In the case of conductive vias 626, an analogous conductive layer may optionally be included as part of die 640b.

Figure 6D:
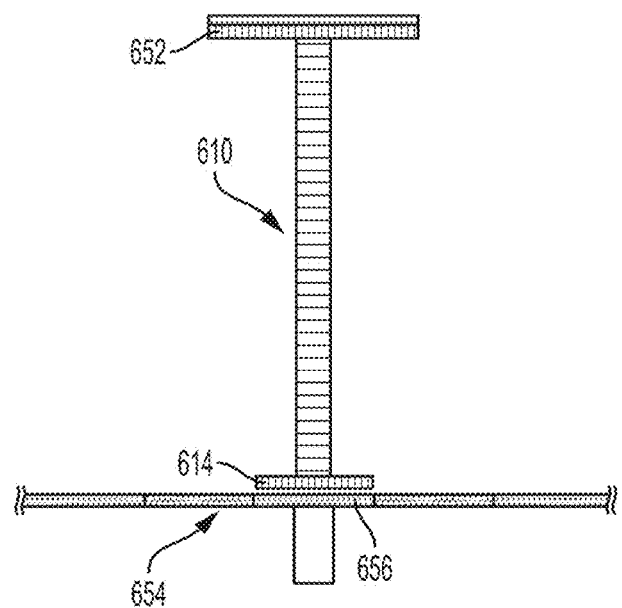
FIG. 6D illustrates a feed of a type which may be implemented in the radio frequency isolator of FIGS. 6A-6B.

FIG. 6D illustrates a non-limiting example of feed 610. The feed 620 has the same construction in some embodiments. The feed 610 may be contacted at a first end by layer 652. The layer 652 may comprise different types of materials depending on whether the feed is a current feed or a voltage feed. When feed 610 is a current feed, the layer 652 may be conductive and may be, for example, the conductive plate 612. When the feed 610 is a voltage feed, the layer 652 may be a dielectric.

The opposite end of the feed 610 may contact a conductive layer, such as the material of conductive plate 614. However, as described previously, to prevent electrical shorting, the feed 610 may be isolated from the rest of the conductive plate 614. In the illustrated embodiment, an insulator 654, such as $SiO_2$, may be provided to electrically isolate the feed 610. An additional conductive layer 656 may optionally be provided and, when provided, may directly contact the conductive plate 614. In some embodiments, the layer 652, feed 610 and conductive plate 614 may be part of a die including substrate 642 and dielectric layer 210. The conductive layer 656, which may be a metal or other conductive material, such as any of those previously described with respect to conductive vias of the radio frequency isolator 600, may be part of die 640a. In the case of feed 620, an analogous conductive layer may optionally be included as part of die 640b.

Figure 7B:
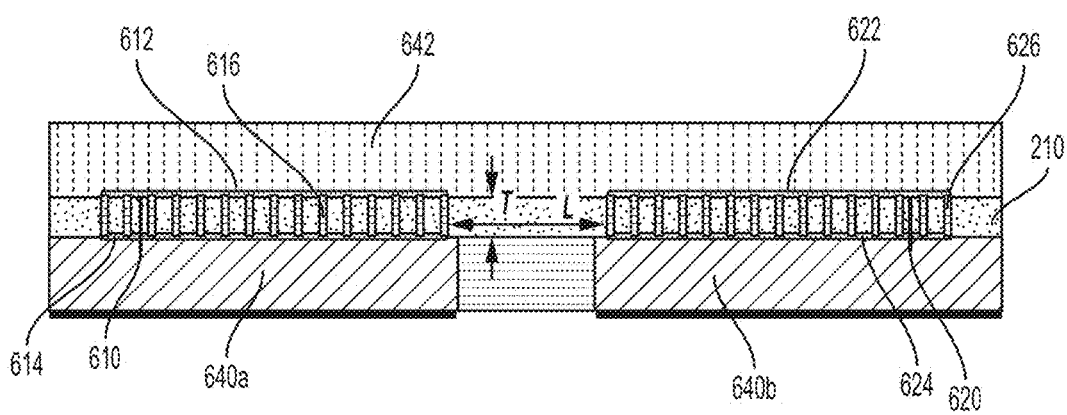
FIG. 7B is a cross-sectional view of a radio frequency isolator having two antennae of the type illustrated in FIG. 7A.

FIGS. 7A-7B illustrate an alternative to FIGS. 6A-6B, providing a perspective view of a microfabricated antenna having an aperture 730 and a cross-sectional view of a radio frequency isolator having two such antennae, respectively. In FIG. 7B the antennae have oppositely oriented apertures. The components of radio frequency isolator 700 are the same as those of radio frequency isolator 600, although the conductive vias 616 and 626 are arranged in a curvilinear configuration instead of the straight line configuration of FIGS. 6A and 6B.

The spacing of various components in the radio frequency isolators 600 and 700 may assume values to provide desired emission and reception of radio frequency signals by the antennae. Referring to FIG. 7A, the feed 610 may be spaced from the nearest conductive via 616 by a distance of approximately ¼ $\lambda$, between ⅕ $\lambda$, and ⅓ $\lambda$, or any value within that range, with $\lambda$, being the wavelength of the emitted radio frequency signal and having any value corresponding to the frequencies described in connection with FIG. 1. The spacing of conductive vias 616 may be approximately 1/10 $\lambda$, between approximately 1/20 $\lambda$, and ¼ $\lambda$, between 1/15 $\lambda$, and ⅓ $\lambda$, or any value within those range, as non-limiting examples.

The distance L between antennae may be approximately 1 mm, between 0.5 mm and 10 mm, or any value or range of values within that range. The thickness T may be approximately 0.5 mm, between 5 microns and 1 mm, between 5 microns and 5 mm, or any value or range of values within those ranges. The apertures 630, 632, and 730 may be approximately 1$\lambda$, between 0.5$\lambda$, and 10$\lambda$, or any value or range of values within that range.

Figure 8A:
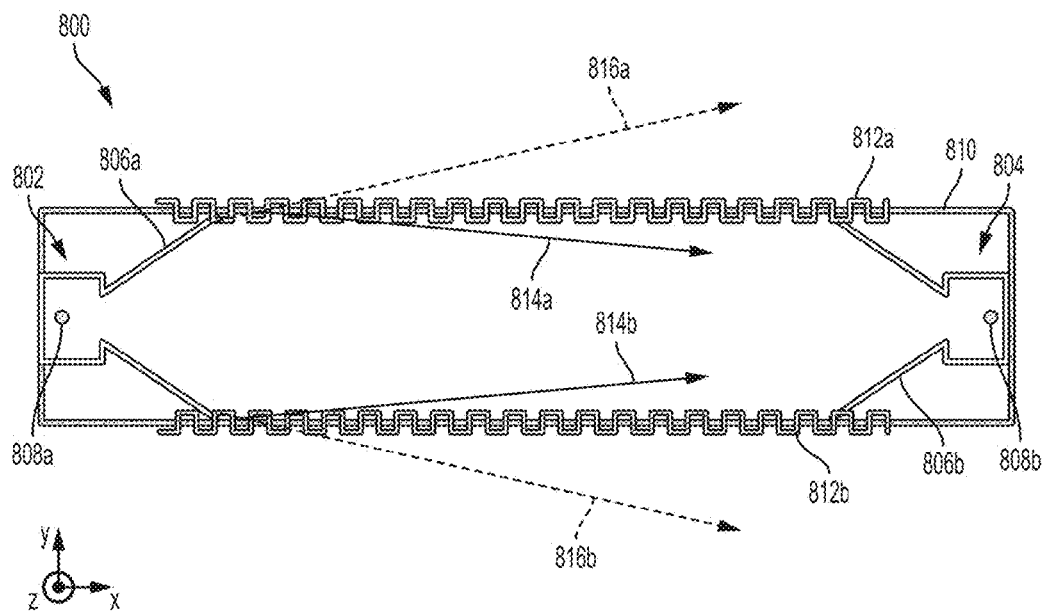
FIG. 8A illustrates a top view of a radio frequency isolator having two antennae and a diffraction grating to direct emissions between the two antennae.
Figure 8B:
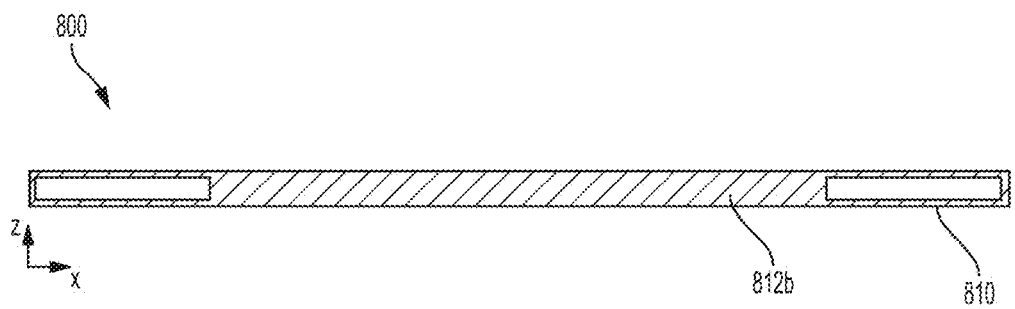
FIG. 8B is a cross-sectional view of the radio frequency isolator of FIG. 9A.

FIG. 8A illustrates a top view of a radio frequency isolator having two antennae and a diffraction grating to direct emissions between the two antennae. FIG. 8B is a cross-sectional view of the radio frequency isolator of FIG. 8A.

The radio frequency isolator 800 includes antennae 802 and 804. The antenna 802 includes a horn 806a and a feed 808a. The antenna 804 includes a horn 806b and a feed 808b. The antennae are provided within a dielectric layer 810, which may comprise any of the materials previously described in connection with dielectric layer 210.

As shown, the dielectric layer 810 includes gratings 812a and 812b. While the dielectric layer 810 is illustrated as having a generally rectangular shape in the top view of FIG. 8A, it should be appreciated that other shapes of the outline of dielectric layer 810 are possible, and include polygonal and rounded shapes. The same is true for all the dielectric layer 210 described herein previously.

Referring to FIG. 8B, and also considering previously described dielectric layer 210, the thickness of the dielectric layer and the relative dielectric constants of the dielectric layer(s) 210 and 810 compared to those of surrounding materials, may provide confinement of radio frequency signals in the z-direction. The gratings 812a and 812b may be provided to confine the radio frequency signals in the y-direction. For example, for radio frequency signals emitted by antenna 802 which impinge on the side boundaries of the dielectric layer 810, the gratings 812a and 812b may result in those radio frequency signals following the paths 814a-814b. That is, the radio frequency signals may be deflected within the dielectric layer 810 and thus toward the antenna 804. Absent the gratings 812a-812b, any such radio frequency signals impinging on the sides of the dielectric layer 810 may exit along the paths 816a-816b.

The illustrated patterning of the gratings 812a-812b represents a non-limiting example. Other configurations of the gratings are possible.

Figure 9A:
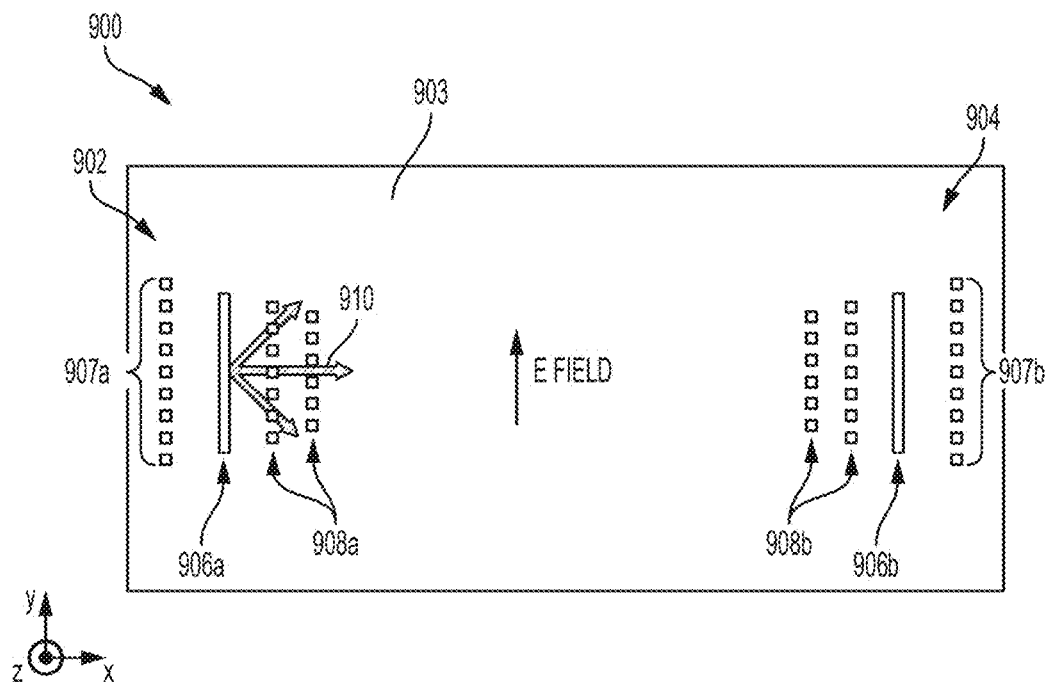
FIG. 9A is a top view of a radio frequency isolator having an antenna with a main element, reflector, and directors.
Figure 9B:
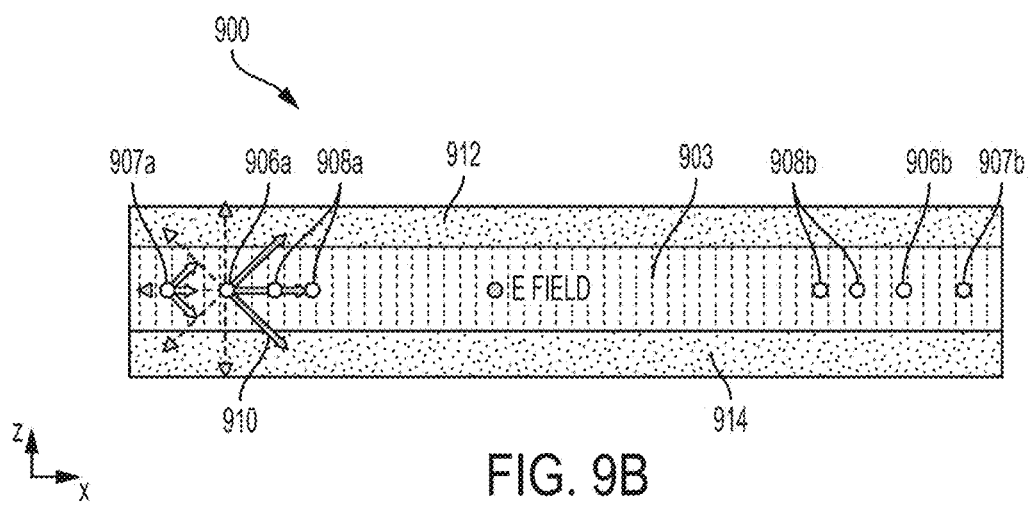
FIG. 9B is a cross-sectional view of the radio frequency isolator of FIG. 9A.

While various antenna configurations have been shown, including those of FIGS. 6A, 7A, and 8A, aspects of the present application are applicable to alternative antenna configurations. Both transverse magnetic (TM) and transverse electric (TE) field antennae may be implemented, although superior confinement of the radio frequency signals in the dielectric slab may result with the use of transverse magnetic field antennae. The antenna may be a Yagi antenna (e.g., a TE Yagi antenna), a log-periodic antenna, a linear array antenna, more generally a dipole array, or other types of directional antennae. FIGS. 9A and 9B illustrate another example.

FIG. 9A is a top view of a radio frequency isolator 900 including antennae 902 and 904. The antenna 902 includes a main element 906a, reflector 907a, and directors 908a. The antenna 904 includes a main element 906b, reflector 907b, and directors 908b. Those components are within a dielectric layer 903 in the illustrated embodiments, but in some embodiments may be outside of but within 10 microns of the dielectric layer 903. The antenna 902 emits radio frequency signals 910 toward the antenna 904. The reflectors 907a and 907b may have a segmented configuration as shown, or may be continuous in some embodiments. The directors 908a and 908b are optional.

In the cross-sectional view of FIG. 9B, it is seen that the radio frequency isolator 900 also includes layers 912 and 914 surrounding the dielectric layer 903. The dielectric layer 903 may be the same material as dielectric layer 210 previously described herein, and in at least some embodiments has a higher dielectric constant than that of layers 912 and 914. Both of layers 912 and 914 may be dielectric layers.

The reflectors and directors of radio frequency isolator 900 may be made of any suitable material and have any suitable configuration for directing the radio frequency signals 910 between the antennae 902 and 904. For example, the reflectors and/or directors may be formed of conductive vias such as those described previously in connection with FIGS. 6A and 7A. However, alternatives are possible.

Thus, it should be appreciated from the foregoing that various antenna types may be implemented according to aspects of the present application. Any of these antenna types may be microfabricated in connection with a dielectric layer configured to confine radio frequency signals to a path between the antennae of the radio frequency isolator.

More generally, radio frequency isolators according to aspects of the present application may include metallic and/or nonmetallic radiating, tuning, reflecting, and/or guiding elements, examples of which have been described. These elements may be configured to provide directional operation of the antenna of the radio frequency isolator, providing a sufficient degree of coupling between antennae. In some embodiments, the antennae of a radio frequency isolator are matching antennae, having the same construction.

Additionally, while the embodiments illustrated in the figures represent scenarios in which the antenna of a radio frequency isolator are disposed horizontally with respect to each other, vertical configurations are also possible. That is, embodiments of the present application include radio frequency isolators having two antennae disposed within different layers of a microfabricated structure and having apertures facing each other. A dielectric layer may be dimensioned to represent a vertical communication path between the antennae, in the same manner as the dielectric layer 210 but oriented vertically. Radio frequency signals may be communicated between the antennae and configured to the dielectric layer by way of the dielectric layer having a higher dielectric constant than surrounding materials.

The radio frequency isolators described herein may be fabricated using microfabrication techniques, such as deposition, lithography, etching, chemical mechanical polishing, or other such techniques. For example, referring to the radio frequency isolator of FIG. 6B, the conductive plates 612 and 622 may be formed on the substrate 642 and patterned into a desired shape. The dielectric layer 210 may be deposited or otherwise formed on the substrate 642. The dielectric layer 210 may then be patterned to form trenches which are filled to create the conductive vias 616 and 626. The conductive plates 614 and 624 may be deposited and patterned to create a desired shape. Subsequently, that structure may be bonded to the die 640a and 640b. The feeds 610 and 620 may be formed prior to the bonding or subsequent. Thus, the structure may be formed using planar processing techniques such as those described.

Radio frequency isolators of the types described herein may provide various benefits. For example, the radio frequency isolators may experience relatively little negative effect from aging, in contrast to optical isolators. The materials of the radio frequency isolators, such as dielectric layers and metal layers, may be robust and experience little negative impact from aging. Also, the radio frequency isolators may be suitable for transmitting signals across a wide range of frequencies. Moreover, the radio frequency isolators may exhibit better common mode transient immunity (CMTI) than that of optical isolators.

The radio frequency isolators described herein may be used in various applications. For example, data transfer and/or power transfer between galvanically isolated systems may be accomplished with the radio frequency isolators described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be a radio frequency isolator of any of the types described herein, and the isolated signal path may be analog or digital.

As another example, industrial equipment may be isolated from a control system controlling the equipment. For example, high wattage motors may be isolated from control systems controlling their operation by radio frequency isolators of the types described herein. The isolator may be disposed on a circuit board on which various circuit components connected to the motors and/or control equipment are included.

Other uses of the radio frequency isolators described herein are also possible, as those examples described are non-limiting.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A radio frequency (RF) isolator, comprising:
a dielectric layer having a dielectric constant between 12 and 500 for frequencies between 5 GHz and 200 Ghz;
first and second antennae disposed at least partially within, or within ten microns of, the dielectric layer; and
a feed circuit disposed in a first die and coupled to the first antenna via a first surface of the first die,
wherein the first antenna is configured to emit a radio frequency signal, and the dielectric layer is configured to confine and transmit the radio frequency signal, and wherein
at least a portion of the first surface does not overlap the dielectric layer in a direction perpendicular from the first surface.

2. The RF isolator of claim 1, wherein a thickness of the dielectric layer is between 5 microns and 5 mm.

3. The RF isolator of claim 1, wherein the first and second antennae are dipole antennae.

4. The RF isolator of claim 3, wherein the dipole antennae are linear or curved.

5. The RF isolator of claim 3, wherein the first antenna is a dipole antenna with a reflector, and wherein the reflector is linear, planar, or curved.

6. The RF isolator of claim 1, wherein the first antenna comprises a feed and a horn formed by a plurality of conductive vertical vias defining an aperture of the first antenna.

7. The RF isolator of claim 1, wherein the horn has a shaped selected from the group consisting of: piece-wise linear polygon; a parabola; or a section of an ellipse.

8. The RF isolator of claim 1, wherein the dielectric layer is a first dielectric layer, wherein the isolator further comprises a second dielectric layer having a dielectric constant less than that of the first dielectric layer, and wherein the first antenna is disposed in the second dielectric layer.

9. The RF isolator of claim 1, wherein the dielectric layer is a first layer, and wherein the isolator further comprises a second dielectric layer adjacent the first dielectric layer and having a dielectric constant less than 12, wherein the first antenna is in the second dielectric layer.

10. A method of operation of a micro-scale isolator, comprising:
emitting a radio frequency signal from a first microfabricated antenna operating in a first voltage domain, the radio frequency signal having a frequency between 5 GHz and 200 GHz, wherein the first microfabricated antenna is coupled to a first surface of a die having a feed circuit;
confining and transmitting the radio frequency signal through a dielectric layer having a dielectric constant between 12 and 500, wherein at least a portion of the first surface does not overlap the dielectric layer in a direction perpendicular from the first surface; and
receiving the radio frequency signal with a second microfabricated antenna operating in a second voltage domain different than the first voltage domain.

11. The method of claim 10, wherein confining and transmitting the radio frequency signal through the dielectric layer comprises confining the radio frequency signal within a height between 5 microns and 5 mm.

12. The method of claim 10, further comprising directing the radio frequency signal through the dielectric layer using an antenna horn.

13. The method of claim 10, further comprising directing the radio frequency signal through the dielectric layer using a reflector of the first antenna.

14. The method of claim 10, wherein confining and transmitting the radio frequency signal through the dielectric layer comprises diffracting the radio frequency signal with a diffraction grating.

15. The method of claim 10, wherein confining and transmitting the radio frequency signal through the dielectric layer comprises confining the radio frequency signal between conductive plates.

16. A system, including:
a first circuit operating in a first voltage domain and disposed on a first die;
a second circuit operating in a second voltage domain less than the first voltage domain and disposed on a second die; and
a radio frequency isolator coupling the first and second circuits to each other, the radio frequency isolator comprising:
a dielectric layer having a dielectric constant between 12 and 500 for frequencies between 5 GHz and 200 Ghz;
first and second antennae disposed at least partially in, or within 10 microns of, the dielectric layer; and
a feed circuit coupled to the first antenna via a first surface of the first die, wherein:
at least a portion of the first surface does not overlap the dielectric layer in a direction perpendicular from the first surface.

17. The system of claim 16, wherein the first and second antennae are formed on a first die flip-chip mounted to a die on which the first circuit is formed.

18. The system of claim 16, wherein the first antenna comprises a feed and a horn formed by a plurality of conductive vertical vias defining the aperture of the first antenna.

19. The system of claim 16, wherein the first antenna is disposed in the dielectric layer.

20. The system of claim 16, further comprising a third die, wherein the dielectric layer is disposed on the third die, and wherein the first and second antennae are disposed in a plane parallel to the first surface.

* * * * *